United States Patent
Nakayama et al.

(10) Patent No.: US 6,175,746 B1
(45) Date of Patent: Jan. 16, 2001

(54) MULTIBAND MOBILE UNIT COMMUNICATION APPARATUS

(75) Inventors: Keiichi Nakayama; Seiichi Yamaguchi; Fujio Sasaki, all of Yokohama; Yukichi Aihara, Kawasaki; Hiroaki Kosugi, Osaka, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 08/828,305

(22) Filed: Mar. 28, 1997

(30) Foreign Application Priority Data

Apr. 8, 1996 (JP) .................................................. 8-110569

(51) Int. Cl.[7] .................................................. H04B 1/38
(52) U.S. Cl. ...................... 455/552; 455/102; 455/180.1; 455/76
(58) Field of Search .................................... 455/102, 552, 455/553, 180.1, 183.1, 188.1, 314, 76, 78, 82, 83, 550, 146, 176, 209, 213, 324

(56) References Cited

U.S. PATENT DOCUMENTS

| | | | |
|---|---|---|---|
| 4,419,768 | * 12/1983 | Yamashita et al. | 455/180 |
| 4,835,792 | * 5/1989 | Davarian | 455/142 |
| 5,003,620 | * 3/1991 | Tenjin | 455/180 |
| 5,369,790 | * 11/1994 | Yokota | 455/164.1 |
| 5,432,779 | * 7/1995 | Shimo et al. | 455/86 |
| 5,437,051 | 7/1995 | Oto | 455/143 |
| 5,732,330 | * 3/1998 | Anderson et al. | 455/76 |

FOREIGN PATENT DOCUMENTS

| | | |
|---|---|---|
| 1550697 | 8/1979 | (GB) . |
| 62-32646 | 7/1987 | (JP) . |
| 6132849 | 5/1994 | (JP) . |

* cited by examiner

Primary Examiner—Daniel S. Hunter
Assistant Examiner—Darnell R. Armstrong
(74) Attorney, Agent, or Firm—Pollock, Vande Sande & Amernick

(57) ABSTRACT

A multiband mobile unit communication apparatus is disclosed which comprises: an antenna for receiving L FRQ bands of M radio wave SIGs modulated by N modulating methods, M>L, M>N, N≧L; a frequency synthesizer for generating a LO SIG; an IF SIG generation CKT for generating M IF SIGs using the LO SIG, the FRQ synthesizer generating the LO SIG such that the M IF SIGs have the same intermediate FRQ; a SW CKT for selectively outputting N IF SIGs modulated by the N modulating methods respectively out of the M IF SIGs; N filters for filtering outputs of N IF SIGs from the SW CKT and outputting N filtered IF SIGs respectively; a SW responsive to a SW CONT signal for selectively outputting one of the N filtered IF SIGs; and a quadrature demodulator for quadrature-demodulating one of N filtered IF SIGs and outputting baseband SIG. Different frequency bands of received signals are converted into IF SIGs having the same intermediate frequency. Moreover, different frequency bands of received signals which are modulated by the same method are filtered by the same IF filter.

9 Claims, 3 Drawing Sheets

MULTIBAND MOBILE UNIT COMMUNICATION APPARATUS

BACKGROUND OF THE INVENTION

1. Field of the Invention

This invention relates to a multiband mobile unit communication apparatus.

2. Description of the Prior Art

A mobile unit communication apparatus for communicating with a third party through a base station and a network is known.

Such a mobile unit communication apparatus is disclosed in Japanese patent application provisional publication No. 6-132849 as RADIO EQUIPMENT AND PORTABLE TELEPHONE SET. FIG. 3 is a block diagram of this prior art mobile unit communication apparatus. In this prior art mobile unit communication apparatus, a smaller number of local oscillators are used. To provide transmission and reception through different frequencies respectively, a local oscillator 11 capable of directly or indirectly oscillating a fundamental wave and its multiple wave is used, and a local oscillator 6 is used for transmission and reception commonly.

SUMMARY OF THE INVENTION

The aim of the present invention is to provide an improved multiband mobile unit communication apparatus.

According to the present invention, a first multiband mobile unit communication apparatus is provided, which comprises: an antenna for receiving first and second frequency bands of radio wave signals modulated by the same modulating method; a local oscillation signal generation circuit for generating a local oscillation signal; a first mixer for mixing the received first frequency band of radio wave signal with the local oscillation signal; a second mixer for mixing the received second frequency band of radio wave signal with the local oscillation signal; a switch for supplying an output from the first mixer in a first mode and supplying an output from the second mixer in a second mode; and a filter for filtering an output of the switch and outputting a first intermediate frequency signal in the first mode and a second intermediate frequency signal in the second mode, the local oscillation signal generation circuit generating the local oscillation signal such that the first intermediate frequency signal has the same frequency as the second intermediate frequency signal.

According to the present invention, a second multiband mobile unit communication apparatus is provided which comprises: an antenna for receiving L frequency bands of M radio wave signals modulated by N modulating methods, L, M, and N being natural numbers, M>L, M>N, N≧2; a frequency synthesizer for generating a local oscillation signal; an intermediate frequency signal generation circuit for generating M intermediate frequency signals using the local oscillation signal, the frequency synthesizer generating the local oscillation signal such that the M intermediate frequency signals have the same intermediate frequency; a switching circuit for selectively outputting N intermediate frequency signals modulated by the N modulating methods respectively out of the M intermediate frequency signals; and N filters for filtering outputs of N intermediate frequency signals from the switching circuit and outputting N filtered intermediate frequency signals respectively.

The second multiband mobile unit communication apparatus may further comprise a switching circuit responsive to a switching control signal for selectively outputting one of the N filtered intermediate frequency signals and a quadrature demodulator for quadrature-demodulating one of N filtered intermediate frequency signals and outputting baseband signal.

According to the present invention, a third multiband mobile unit communication apparatus is provided which comprises: an antenna for receiving L frequency bands of M radio wave signals modulated by N modulating methods, L, M, and N being natural numbers, M>L, M>N, N≧L; a frequency synthesizer for generating a local oscillation signal; an intermediate frequency signal generation circuit for generating M intermediate frequency signals using the local oscillation signal, the frequency synthesizer generating the local oscillation signal such that the M intermediate frequency signals have the same intermediate frequency; a switching circuit for selectively outputting N intermediate frequency signals modulated by the N modulating methods respectively out of the M intermediate frequency signals; N filters for filtering outputs of N intermediate frequency signals from the switching circuit and outputting N filtered intermediate frequency signals respectively; a switching circuit responsive to a switching control signal for selectively outputting one of the N filtered intermediate frequency signals; and a quadrature demodulator for quadrature-demodulating one of N filtered intermediate frequency signals and outputting baseband signal.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

Hereinbelow will be described a first embodiment of this invention.

Figure 1:
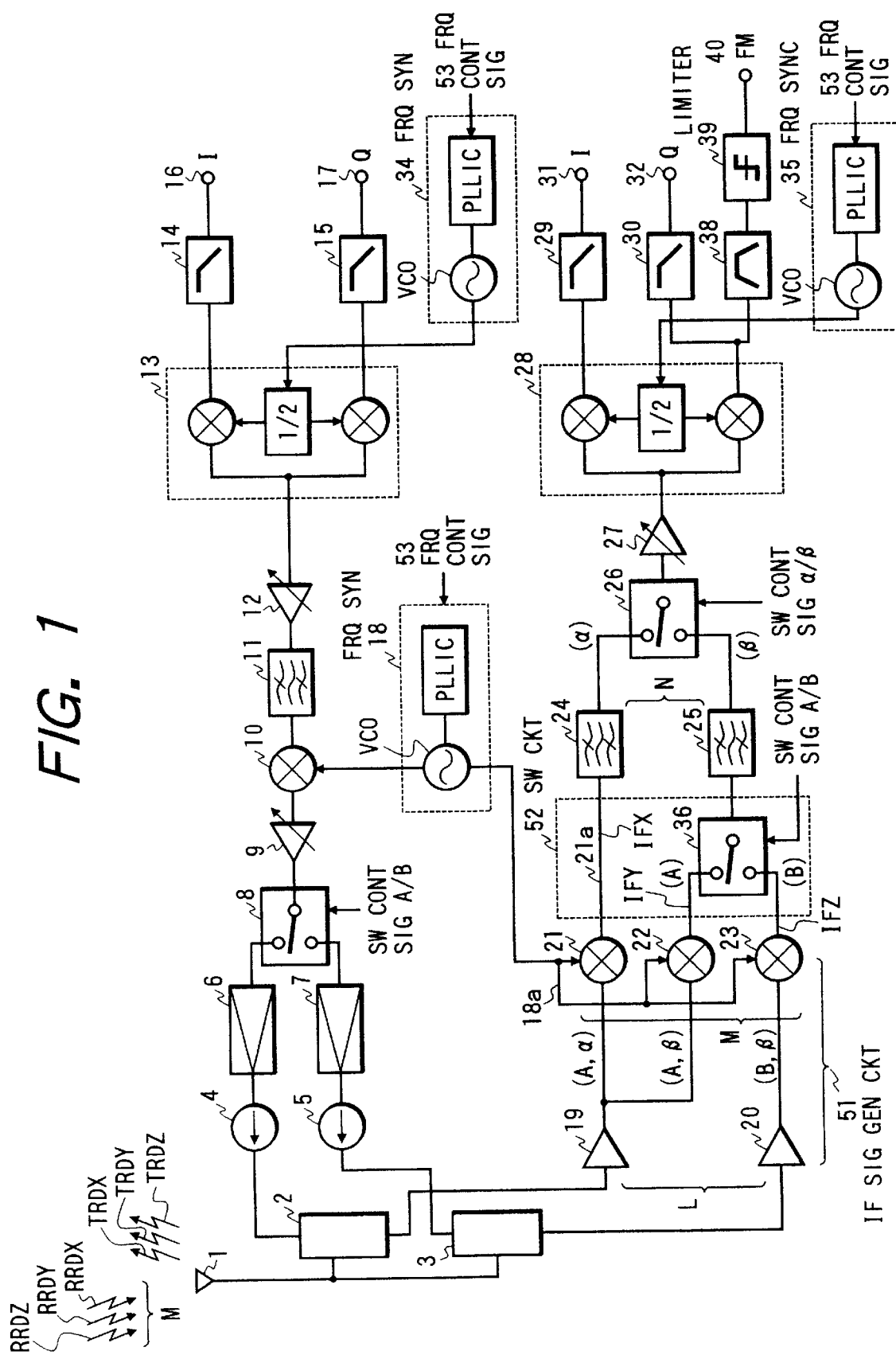
FIG. 1 is a block diagram of a multiband mobile unit communication apparatus of a first embodiment.

FIG. 1 is a block diagram of a multiband mobile unit communication apparatus of the first embodiment.

The multiband mobile unit communication apparatus of the first embodiment operates in a mobile unit communication system X using a radio frequency band A through a communication method α, a mobile communication system Y using the radio wave frequency band A through a communication method β, and a mobile unit communication system Z using a radio wave frequency band B through through communication method β.

The multiband mobile unit communication apparatus of the first embodiment comprises a transmission portion, a receiving portion, duplexers 2 and 3 for providing separation between the transmission portion and the receiving portion, and an antenna 1 for transmission and receiving radio wave signals.

The transmission portion includes: low pass filters 14 and 15 for removing unnecessary components in transmission I and Q signals, a quadrature modulator 13 for quadrature-modulating the transmission I and Q signals from the low pass filters 14 and 15 with a local oscillation signal from a frequency synthesizer 34 responsive to a frequency control signal 53, a variable gain amplifier 12 for amplifying an output of the quadrature modulator 13 with its gain controlled, a low pass filter 11 for removing unnecessary components in an output of the variable gain amplifier 12, a transmission mixer 10 for up-converting the transmission signal from the low pass filter 11 into a first or second high frequency transmission signal using an oscillation signal from a frequency synthesizer 18, a variable gain amplifier 9 for amplifying the high frequency transmission signal from the mixer 10 with its gain controlled, power amplifiers 6 and 7, a switch 8 for outputting either the first high frequency transmission signal to the power amplifier 6 or the second high frequency transmission signals to the power amplifier 7, and isolators 4 and 5 for isolating duplexers 2 and 3 from the power amplifiers 6 and 7.

The duplexers 2 and 3 provide simultaneous transmission and receiving operations. The antenna 1 transmits either of the transmission signals TRDX, TRDY, TRDZ from either of the duplexer 2 or 3 and receives reception radio wave signals RRDX, RRDY, and/or RRDZ. The reception signal from the antenna 1 is supplied to the duplexers 2 and 3.

The receiving portion includes a low noise amplifier 19 for amplifying the reception radio wave signal RRDX or RRDY from the duplexer 2, a low noise amplifier 20 for amplifying the reception radio wave signal signal RRDZ from the duplexer 3, a receiving mixer 21 for mixing a local oscillation signal from the frequency synthesizer 18 with an output signal from the low noise amplifier 19 to generate an intermediate frequency signal IFX corresponding to the reception radio wave signal RRDX, a receiving mixer 22 for mixing the local oscillation signal from the frequency synthesizer 18 with the output signal from the low noise amplifier 19 to generate an intermediate frequency IFY signal corresponding to the reception radio wave signal RRDY, a receiving mixer 23 for mixing the local oscillation signal from the frequency synthesizer 18 with an output signal from the low noise amplifier 20 to generate an intermediate frequency signal IFZ corresponding to the reception radio wave signal RRDZ, an intermediate frequency switch 36 for outputting either of the intermediate frequency signal IFY or IFZ, band pass filters 24 and 25 for removing unnecessary components in the intermediate frequency signals IFX and and an output of the intermediate frequency switch 36 (IFY or IFZ) respectively, an intermediate frequency switch 26 for outputting either of outputs of the band pass filters 24 or 25, a variable gain amplifier 27 for amplifying an output of the intermediate frequency switch 26 with its gain controlled, a frequency synthesizer 35 for generating a local oscillation signal, a quadrature demodulation circuit 28 for quadrature-demodulating an output of the variable gain amplifier 27 with the local oscillation signal from the frequency synthesizer 35 and outputting I and Q baseband signals, low pass filters 29 and 30 for removing unnecessary components in the I and Q base band signals. Either of the I and Q base band signal from the quadrature demodulator 28 is also used for frequency modulation reception. That is, the Q base band signal from the quadrature demodulator 28 is supplied to a band pass filter 38 for FM demodulating the Q base band signal, and a limiting amplifier 39 for limiting an amplitude of the FM signal from the band bass filter 38.

In this multiband mobile unit communication apparatus, the same intermediate frequency filter 25 is commonly used for receiving the radio wave signals subjected to the same modulation method β but having different frequency bands A and B. That is, the intermediate frequency filter 25 is provided for generating the intermediate frequency signal from the reception radio wave signal RRDY or RRDZ subjected to the same modulation method α. In other words, the number of the intermediate frequency filters 24 and 25 corresponds to that of the modulation methods α and β of the reception signals. The frequency synthesizer 18 generates the local oscillation signal, that is, controls the local oscillation frequency, such that the intermediate frequency signals from the receiving mixers 21, 22, and 23 have the same frequency. The intermediate frequency switch 36 responsive to a switching control signal A/B outputs the intermediate frequency signal corresponding to the mobile unit communication system Y from the receiving mixer 22 when the reception radio wave signal RRDY is received and the intermediate frequency signal corresponding to the mobile unit communication system Z from the receiving mixer 23 when the reception radio wave signal RRDZ is received. The intermediate frequency switch 26 responsive to a switching control signal α/β outputs the intermediate frequency signal corresponding to the mobile unit communication system X using the modulation method α from the receiving mixer 22 when the reception radio wave signal RRDX is received and the intermediate frequency signal subjected to the modulation method β from the receiving mixer 23.

The I and Q transmission baseband signals from input terminals 16 and 17 are modulated by the quadrature modulator 13, and up-converted by the transmission mixer 10, gain-adjusted by the variable gain amplifier 9, and is supplied to the power amplifiers 6 and 7 via the high frequency switch 8. More specifically, the power amplifier 6 is used for transmitting the transmission signal toward the mobile unit communication systems X and Y using the same frequency band A and the power amplifier 7 is used for transmitting the transmission signal toward the mobile unit communication system Z using the frequency band B. The antenna 1 transmits the transmission signal from the power amplifier 6 or 7 via the isolator 4 or 5 and the duplexer 2 or 3 to a base station.

On the other hand, a portion of or all of the reception signals RRDX, RRDY RRDZ are received by the antenna 1. The reception signals RRDX and RRDY are supplied to the low noise amplifier 19 through the duplexer 2 and the reception signal RRDZ from the antenna 1 is supplied to the low noise amplifier through the duplexer 3. The low noise amplifier 19 has a frequency characteristic corresponding to the frequency band A and the low noise amplifier 20 has a frequency characteristic corresponding to the frequency band B. The receiving mixers 21 to 23 convert the reception signals RRDX, RRDY, and RRDZ from the low noise amplifiers 19 and 20 into the intermediate frequency signals every frequency bands and every modulation method.

The frequency synthesizer 18 generates the local oscillation signal 18a, that is, controls the local oscillation frequency, such that the intermediate frequency signals from the receiving mixers 21, 22, and 23 have the same frequency. The receiving mixer 21 is used for receiving the reception radio wave signal RRDX from the mobile unit communication system X, the receiving mixer 22 is used for receiving the reception radio wave signal RRDY from the mobile unit communication system Y, and the mixer 23 is used for receiving the reception radio wave signal RRDZ from the mobile unit communication system Z.

The intermediate frequency filters 24 and 25 are provided in accordance with the number of the modulation methods. More specifically, the intermediate frequency filter 24 corresponds to the mobile unit communication system X using the modulation method α, the intermediate frequency filter 25 corresponds to the mobile unit communication system Y or Z using the modulation method β.

The intermediate frequency switch 36 outputs the output of the receiving mixer 22 when this mobile unit communication apparatus receives the reception radio wave signal RRDY from the mobile unit communication system Y and outputs the output of the receiving mixer 23 when this mobile unit communication apparatus receives the reception radio wave signal RRDZ from the mobile unit communication system Z.

The intermediate frequency switch 26 selects the output of the intermediate frequency filter 24 when the modulation method of the mobile unit communication system is α and selects the output of the intermediate frequency filter 25 when the modulation method of the mobile unit communication system is β. The output of the intermediate frequency switch 26 is gain-adjusted by the variable gain amplifier 27, and then, is converted into I and Q demodulation signals by the quadrature demodulator 28.

If the received signal is the FM signal, the quadrature demodulator 28 is used as a receiving second mixer to convert it into a second FM intermediate frequency signal and the Q signal from the quadrature demodulator 28 is demodulated by the bandpass filter 38 for FM signals and the limiter amplifier 39 and outputted as FM intermediate frequency signal. In this case, the second local oscillator 35 has a synthesizer structure to operate for the I and Q demodulation and the FM intermediate frequency demodulation.

In this mobile unit communication apparatus, it is assumed that:
transmission and receiving center frequencies in the mobile unit communication system X using the radio frequency band A and the communication method α are 835 MHz and 880 MHz respectively;
transmission and receiving center frequencies in the mobile unit communication system Y using the radio frequency band A and the communication method β are 835 MHz and 880 MHz respectively; and
transmission and receiving center frequencies in the mobile unit communication system Z using the radio frequency band B and the communication method β are 1880 MHz and 1960 MHz respectively.

The intermediate frequencies among the respective systems are equalized by providing a frequency relation as shown in table 1 with respect to the center frequency fL1 of the first local oscillator 18 corresponding to respective radio wave frequency bands, the receiving intermediate frequency fIF, and the local oscillation frequency fmod for transmission.

Actually, an oscillation frequency of the voltage controlled oscillator 34 is twice fmod because the quadrature modulator 13 includes a ½-frequency divider. Moreover, it is assumed that the modulation method α is a narrow band modulation method such as the FM modulation method and the communication method β is a broad band modulation method such as the spread spectrum communication method.

TABLE 1

|  | COM METHOD | FRQ BAND | fL1 (MHz) | fIF (MHz) | fmod (MHz) |
|---|---|---|---|---|---|
| MOBILE COM SYS X | α | A | 1090 | 210 | 255 |

TABLE 1-continued

|  | COM METHOD | FRQ BAND | fL1 (MHz) | fIF (MHz) | fmod (MHz) |
|---|---|---|---|---|---|
| MOBILE COM SYS Y | β | A | 1090 | 210 | 255 |
| MOBILE COM SYS Z | β | B | 1750 | 210 | 130 |

Then, the following relation provides an equalized receiving intermediate frequencies.

$$ftxX = fL1(X) - fmod(X) = ftxY$$
$$frxX = fL1(x) - fIF(X) = frxY$$
$$ftxZ = fL1(Z) + fmod(Z)$$
$$frxZ = fL1(Z) + fIF(Z) \qquad (1)$$

This frequency relation is an example and it is sufficient to determine the fl1 and fmod such that ftx=fL1±fmod, frx=fL1±fIF, and fIFs become the same among respect communication methods.

As mentioned, the multiband mobile unit communication apparatus of the first embodiment comprises: the antenna 1 for receiving L frequency bands of M radio wave signals modulated by N modulating methods, L, M, and N being natural numbers, M>L, M>N, N≧L; the frequency synthesizer 18 for generating the local oscillation signal 18a; an intermediate frequency signal generation circuit 51 including the low noise amplifiers 19 and 20, and the receiving mixers 21 to 23 for generating M intermediate frequency signals using the local oscillation signal 18a, the frequency synthesizer 18 generating the local oscillation signal 18a such that the M intermediate frequency signals have the same intermediate frequency; the switching circuit 52 including the line 21a between the receiving mixer 21 and the intermediate frequency filter 24 and the intermediate frequency switch 36 for selectively outputting N intermediate frequency signals modulated by the N modulating methods respectively out of the M intermediate frequency signals; the N filters 24 and 25 for filtering outputs of N intermediate frequency signals from the switching circuit 52 and outputting N filtered intermediate frequency signals respectively; the intermediate frequency switch 26 responsive to a switching control signal α/β for selectively outputting one of the N filtered intermediate frequency signals; and the quadrature demodulator 28 for quadrature-demodulating one of N filtered intermediate frequency signals and outputting baseband signal.

As mentioned, different frequency bands of received signals are converted into the intermediate frequency signals having the same intermediate frequency. Moreover, different frequency bands of received signals which are modulated by the same method are filtered by the same intermediate frequency filter 25.

A second embodiment will be described.

Figure 2:
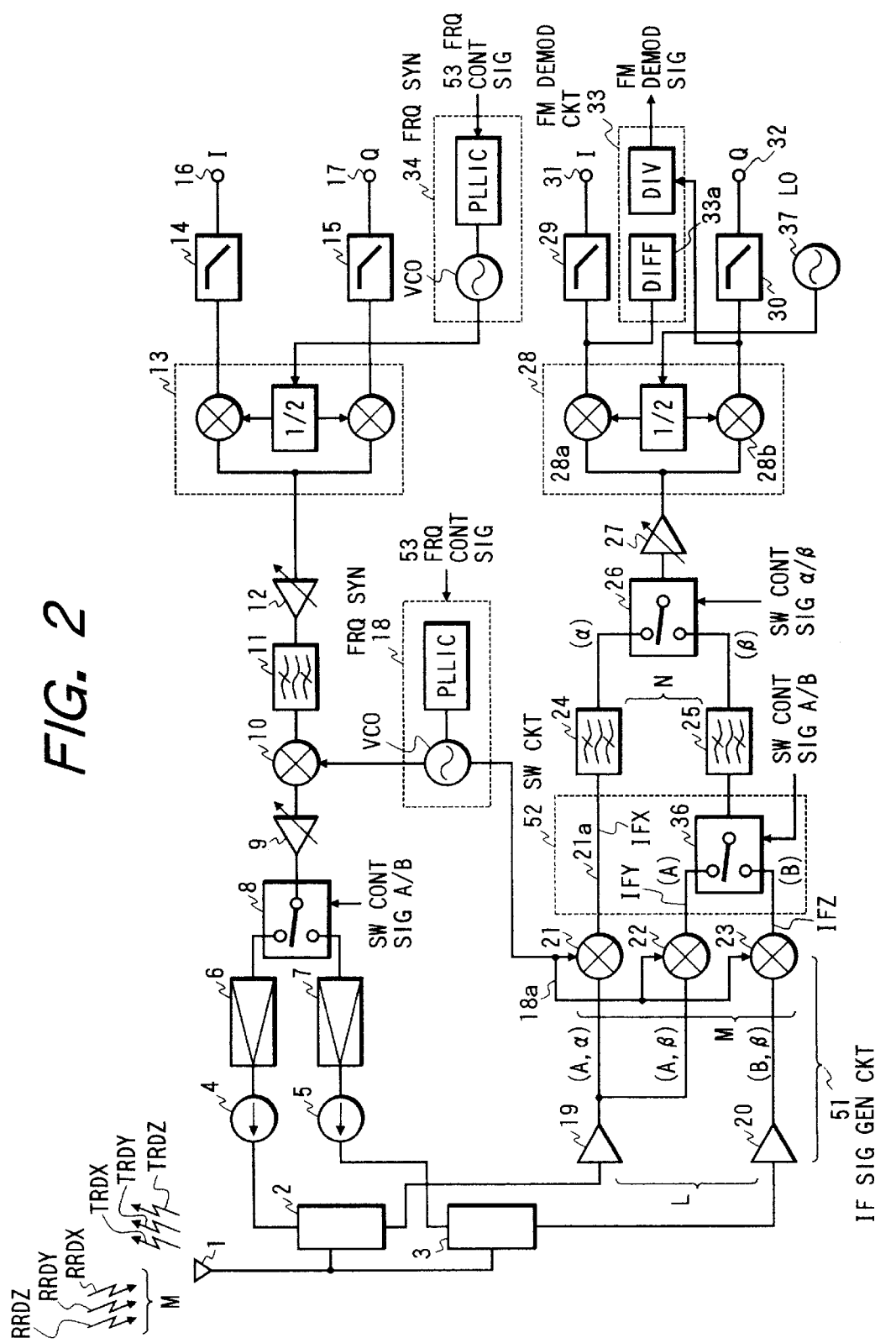
FIG. 2 is a block diagram of a multiband mobile unit communication apparatus of a second embodiment.
Figure 3:
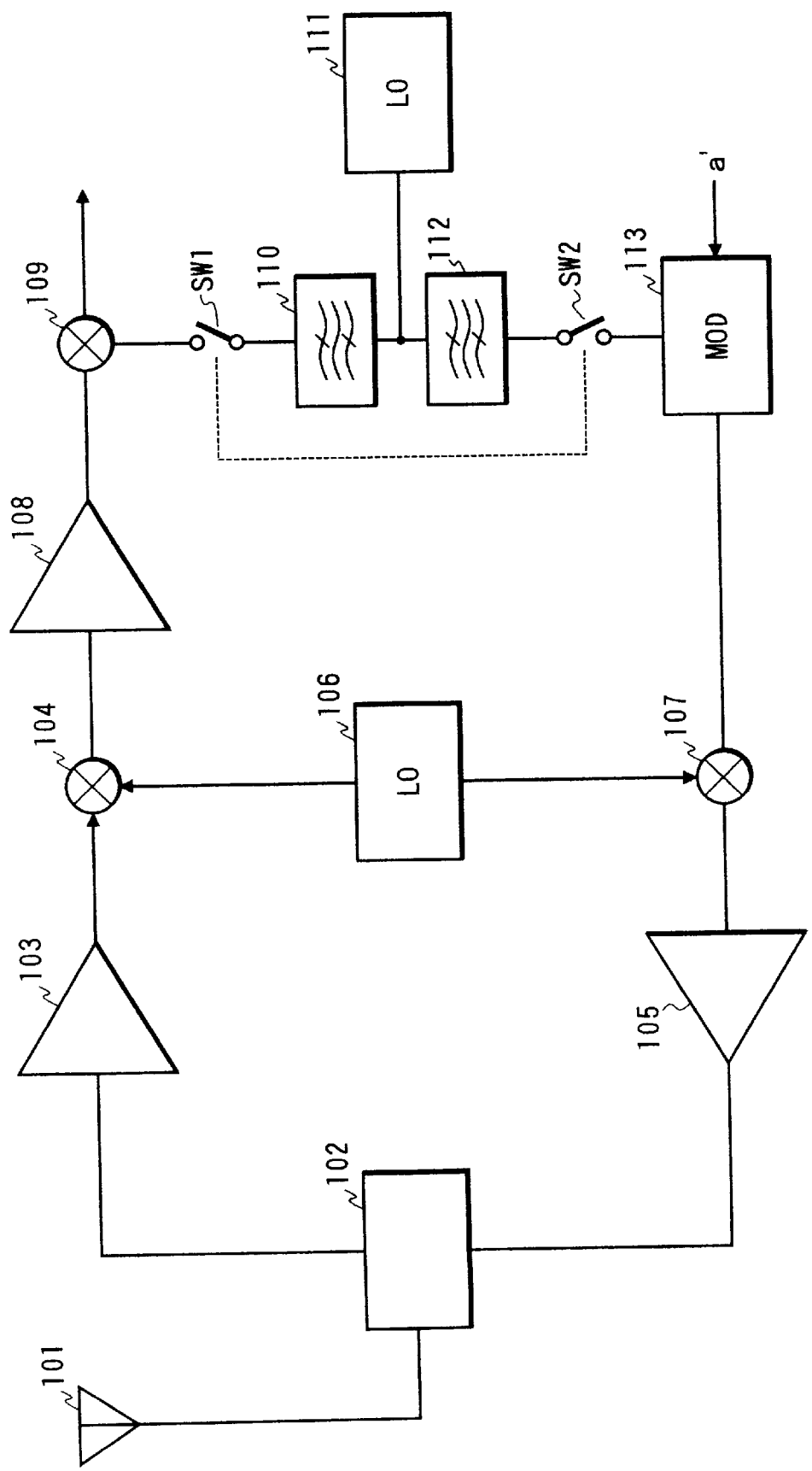
FIG. 3 is a block diagram of a prior art mobile unit communication apparatus.

FIG. 2 is a block diagram of a multiband mobile unit communication apparatus of the second embodiment.

The multiband mobile unit communication apparatus of the second embodiment has substantially the same structure as that of the first embodiment. The difference is that an FM demodulator 33 replaces the band pass filter 38 and the limiter 39 and a local oscillator 37 having a fixed local oscillation frequency replaces the frequency synthesizer 35.

The FM demodulator 33 comprises a differentiator 33a for differentiating the output of a mixer 28a, that is, the I signal, and a divider 33b for dividing an output of the output of the differentiator 33a by an output of the mixer 28b, that is, the Q signal to output a frequency demodulated baseband signal.

The differentiator 33a differentiates the output of the mixer 28a, that is, the I signal. The divider 33b divides the output of the output of the differentiator 33a by the Q signal and outputs the frequency demodulated baseband signal.

In this embodiment, the frequency of a reference signal for the quadrature demodulator 28 can be fixed though the demodulation method is changed.

What is claimed is:

1. A multiband mobile unit communication apparatus comprising:

an antenna for receiving L frequency bands of M radio wave signals modulated by N modulating methods, L, M, and N being natural numbers, M>L, M>N, N≧2;

a frequency synthesizer for generating a local oscillation signal;

an intermediate frequency signal generation circuit for generating M intermediate frequency signals using said local oscillation signal, said frequency synthesizer generating said local oscillation signal such that said M intermediate frequency signals have the same intermediate frequency;

a switching circuit for selectively outputting N intermediate frequency signals modulated by said N modulating methods respectively out of said M intermediate frequency signals; and N filters for filtering outputs of N intermediate frequency signals from said switching circuit and outputting N filtered intermediate frequency signals respectively.

2. A multiband mobile unit communication apparatus as claimed in claim 1, further comprising a switching circuit responsive to a switching control signal for selectively outputting one of said N filtered intermediate frequency signals and a quadrature demodulator for quadrature-demodulating said one of N filtered intermediate frequency signals and outputting baseband signal.

3. A multiband mobile unit communication apparatus comprising:

an antenna for receiving L frequency bands of M radio wave signals modulated by N modulating methods, L, M, and N being natural numbers, M>L, M>N, N≧2;

a frequency synthesizer for generating a local oscillation signal;

an intermediate frequency signal generation circuit for generating M intermediate frequency signals using said local oscillation signal, said frequency synthesizer generating said local oscillation signal such that said M intermediate frequency signals have the same intermediate frequency;

a switching circuit for selectively outputting N intermediate frequency signals modulated by said N modulating methods respectively out of said M intermediate frequency signals;

N filters for filtering outputs of N intermediate frequency signals from said switching circuit and outputting N filtered intermediate frequency signals respectively;

a switch responsive to a switching control signal for selectively outputting one of said N filtered intermediate frequency signals; and a quadrature demodulator for quadrature-demodulating said one of N filtered intermediate frequency signals and outputting baseband signal.

4. The multiband mobile unit communication apparatus as claimed in claim 3, wherein said quadrature demodulator is commonly used to demodulate signals produced from said N modulating methods.

5. A multiband mobile unit communication apparatus comprising:

an antenna for receiving frequency bands of radio wave signals modulated by N modulating methods, at least two radio wave signals being modulated by the same modulating methods, N being a natural number more than one;

a frequency synthesizer for generating a local oscillation signal;

intermediate frequency signal generation means for generating intermediate frequency signals from said radio wave signals using said local oscillation signal, said frequency synthesizer generating said local oscillation signal such that said intermediate frequency signals have the same intermediate frequency;

switching means for selectively outputting N intermediate frequency signals modulated by said N modulating methods respectively out of said intermediate frequency signals whereby one of the intermediate frequency signals generated from said at least two radio wave signals is selected; and N filters for filtering outputs of N intermediate frequency signals from said switching circuit and outputting N filtered intermediate frequency signals respectively.

6. The multiband mobile unit communication apparatus as claimed in claim 5, further comprising a switch responsive to a switching control signal indicative of one of said N methods for selectively outputting one of said N filtered intermediate frequency signals in accordance with said one of said N methods; and a quadrature demodulator for quadrature-demodulating said one of N filtered intermediate frequency signals and outputting a baseband signal, wherein said quadrature demodulator is commonly used to demodulate signals modulated by said N methods.

7. The multiband mobile unit communication apparatus as claimed in claim 3, wherein said switching control signal is indicative of one of said N methods and said switch selectively outputs one of said N filtered intermediate frequency signals in accordance with aid one of said N methods.

8. A multiband mobile unit communication apparatus comprising:

an antenna for receiving multiple radio wave signals in at least first and second frequency bands, said signals in said first frequency band being modulated by either a first or second modulating method, said signals in said second frequency band being modulated by said second modulating method;

a frequency synthesizer for generating a local oscillator signal;

an intermediate frequency generation means connected to receive said local oscillator signal and said multiple signals in said first and second frequency bands, and producing a first intermediate frequency signal from signals in said first frequency band modulated with said first modulating method, a second intermediate frequency signal from signals in said first frequency band modulated with said second modulating method, and a third intermediate frequency signal from signals in said second frequency band modulated with said second modulating method; said first, second and third intermediate frequency signals having the same frequency;

a first filter for filtering said first intermediate frequency signal;

a second filter for filtering said second and third intermediate frequency signals; and switching means for supplying one of said second and third intermediate signal to said second filter when a signal in one of said first and second frequency bands, modulated by said second modulating method, is being received by said antenna.

9. The multiband mobile unit according to claim 8 further comprising a second switching means for receiving signals from said first and second filters, and applying signals from said first or said second filters to a baseband demodulation means.

* * * * *